(12) United States Patent
Yan

(10) Patent No.: US 10,651,247 B2
(45) Date of Patent: May 12, 2020

(54) CURVED DISPLAY, DISPLAY MODULE AND DISPLAY TERMINAL

(71) Applicant: WUHAN CHINA STAR OPTOELECTRONICS SEMICONDUCTOR DISPLAY TECHNOLOGY CO., LTD., Wuhan, Hubei (CN)

(72) Inventor: Weinan Yan, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 27 days.

(21) Appl. No.: 16/094,475

(22) PCT Filed: Aug. 28, 2018

(86) PCT No.: PCT/CN2018/102784
§ 371 (c)(1),
(2) Date: Oct. 18, 2018

(87) PCT Pub. No.: WO2019/232942
PCT Pub. Date: Dec. 12, 2019

(65) Prior Publication Data
US 2019/0371869 A1     Dec. 5, 2019

(30) Foreign Application Priority Data

Jun. 5, 2018   (CN) .......................... 2018 1 0567601

(51) Int. Cl.
*H01J 1/62*     (2006.01)
*H01L 27/32*    (2006.01)
*H01L 51/00*    (2006.01)

(52) U.S. Cl.
CPC ...... *H01L 27/3244* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

2002/0027636 A1   3/2002   Yamada
2014/0231763 A1   8/2014   Kim
2014/0320543 A1   10/2014  Oh

FOREIGN PATENT DOCUMENTS

CN      104124261 A     10/2014
CN      104751747 A      7/2015
(Continued)

*Primary Examiner* — Vip Patel
(74) *Attorney, Agent, or Firm* — Mark M. Friedman

(57) ABSTRACT

A flexible curved display comprises a flexible glass portion and a flexible display panel connected to the flexible glass portion. The flexible display panel comprises a flat section and a bending section, the flat section and the bending section projecting along a same projection direction to respectively define a first projection area and a second projection area on a same projection plane; a plurality of pixels on the flexible display panel projecting along the projection direction to define plural projection points on the projection plane, the projection points satisfying a predetermined condition, and the predetermined condition comprising same distance between adjacent projection points along a same reference direction. The distance between the subpixels of the bending section is the same as the distance between the subpixels of the flat section. Thus, it can solve deformation issues and improve display performance.

20 Claims, 9 Drawing Sheets

(56) References Cited

FOREIGN PATENT DOCUMENTS

| | | |
|---|---|---|
| CN | 105374291 A | 3/2016 |
| CN | 105739156 A | 7/2016 |

CURVED DISPLAY, DISPLAY MODULE AND DISPLAY TERMINAL

FIELD OF INVENTION

The present invention relates to a display, and more specifically, to a flexible curved display, display module and display terminal.

BACKGROUND OF INVENTION

Active matrix organic light emitting diodes (AMOLEDs) are products having high growth potential in future display markets. Especially, flexible AMOLEDs can satisfy high requirements for mobile products from the display market. Pixel distribution of a conventional flexible AMOLED display is shown as FIG. 1. When the flexible display is flat, a distance between each subpixel is same. However, when it is bending, the horizontal distance between each pixel of the bending section becomes shorter. Therefore, when one faces the display device, display content of the bending section is pressed, resulting in deformation. In summary, conventional display content of the bending section has deformation issues and it results in bad user experience when watching display products.

SUMMARY OF INVENTION

An object of the present invention is to provide a curved display, display module and a display terminal to prevent the deformation from the bending section. To achieve the above object, an embodiment of the present invention provides a flexible curved display, comprising: a flexible glass portion and a flexible display panel connected to the flexible glass portion; wherein, the flexible display panel comprises a flat section and a bending section, the flat section and the bending section projecting along a same projection direction to respectively define a first projection area and a second projection area on a same projection plane. A plurality of pixels on the flexible display panel project along the projection direction to define plural projection points on the projection plane. The projection points satisfy a predetermined condition. The predetermined condition comprises same distance between adjacent projection points along a same reference direction. The reference direction extends across the first projection area and the second projection area; and all light emitting directions of all pixels on the flexible display panel are the same and parallel to the projection direction.

In an embodiment of the present invention, the flexible display panel comprises a flat section, a bending section and a cross section of the bending section is a straight line.

In an embodiment of the present invention, the flexible display panel comprises a flat section, a bending section and a cross section of the bending section is an arc line.

In an embodiment of the present invention, the flexible display panel comprises a flat section and two bending sections disposed on two sides of the flat section and the bending sections are opposite to each other and both cross sections of the bending sections are straight lines.

In an embodiment of the present invention, the flexible display panel comprises a flat section and two bending sections disposed on two sides of the flat section and the bending sections are opposite to each other and both cross sections of the bending sections are arc lines.

In an embodiment of the present invention, the flexible display panel comprises a flat area and two bending sections located on two sides of the flat section and the bending sections are opposite to each other and one cross section of the bending sections is an arc line and another cross section of the bending sections is a straight line.

In an embodiment of the present invention, the flexible display panel comprises two flat sections and a bending section disposed between the flat sections and a cross section of the bending section is an arc line.

In an embodiment of the present invention, the flexible display panel comprises two flat sections and a bending section disposed between the flat sections and a cross section of the bending section is made of two arc lines and one straight line.

In an embodiment of the present invention, the flexible display panel comprises two separate flat sections and two bending sections and cross sections of the bending sections are arc lines.

In an embodiment of the present invention, the flexible display panel comprises two separate flat sections and two bending sections and a cross section of the bending section connected to the flat sections is an arc line and a cross section of another bending section is a straight line.

In an embodiment of the present invention is a flexible curved display, comprising: a flexible glass portion and a flexible display panel connected to the flexible glass portion. Wherein, the flexible display panel comprises a flat section and a bending section. The flat section and the bending section project along a same projection direction to respectively define a first projection area and a second projection area on a same projection plane. A plurality of pixels on the flexible display panel project along the projection direction to define plural projection points on the projection plane. The projection points satisfy a predetermined condition, and the predetermined condition comprises same distance between adjacent projection points along a same reference direction, and the reference direction extends across the first projection area and the second projection area.

In an embodiment of the present invention, the projection direction is perpendicular to the projection plane.

In an embodiment of the present invention, the reference direction is perpendicular to an intersection of the first projection area and the second projection area.

In an embodiment of the present invention, the projection plane is parallel to a surface of the flat section or the projection plane is a surface of the flat section.

In an embodiment of the present invention, a shape of the first projection section is irregular.

In an embodiment of the present invention, a cross section of the flat section is a straight line and a cross section of the bending section is a straight line; a distance between adjacent pixels in the flat section along the reference direction is S1; a distance between adjacent pixels in the bending section is S2; an acute angle between the bending section and the flat section is a and satisfies the equation: $S1 = S2 * \cos(a)$.

In an embodiment of the present invention, a cross section of the flat section is a straight line and a cross section of the bending section is an arc line; a distance between adjacent pixels in the flat section along the reference direction is S; two acute angles between each tangent of the adjacent pixels in the bending section and a surface of the flat section are respectively b and c; further a radius of curvature of the bending section is R and satisfies the equation: $S = R * \sin(b) - R * \sin(c)$.

In an embodiment of the present invention, a distance between the adjacent pixels is L and satisfies the equation: $L = R(b-c)$.

In an embodiment of the present invention is a display module comprises the flexible curved display described above.

In an embodiment of the present invention is a display terminal comprises the display module described above.

An advantage of the embodiment of the present disclosure provides a flexible curved display, comprising: a flexible glass portion and a flexible display panel connected to the flexible glass portion; wherein, the flexible display panel comprises a flat section and a bending section, the flat section and the bending section projecting along a same projection direction to respectively define a first projection area and a second projection area on a same projection plane; a plurality of pixels on the flexible display panel projecting along the projection direction to define plural projection points on the projection plane, the projection points satisfying a predetermined condition, and the predetermined condition comprising same distance between adjacent projection points along a same reference direction, and the reference direction extending across the first projection area and the second projection area. Therefore, if we look toward the display terminal along the projection direction, the distance between the subpixels of the bending section is the same as the distance between the subpixels of the flat section. Thus, the display content of the bending section isn't pressed to have the deformation. The present invention can solve the deformation issues of the conventional flexible curved display and can effectively improve the display performance.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
FIG. 1 is a schematic pixels structural diagram of a conventional flexible curved display panel in flat status.
Figure 2:
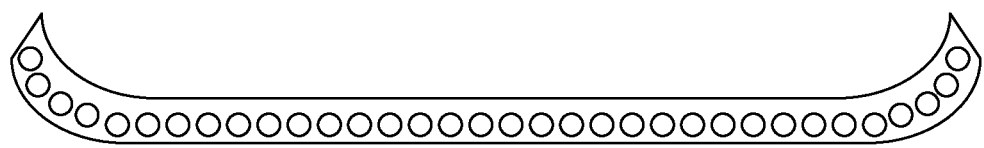
FIG. 2 is a schematic pixels structural diagram of a conventional flexible curved display panel in bending status.

In the description of the present disclosure, it should be understood that terms such as "upper," "lower," "front," "rear," "left," "right," "inside," "outside," "lateral," as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure.

The present invention can solve deformation issues in the bending section of the conventional curved display and it can effectively improve display performance and user experience.

Figure 3:
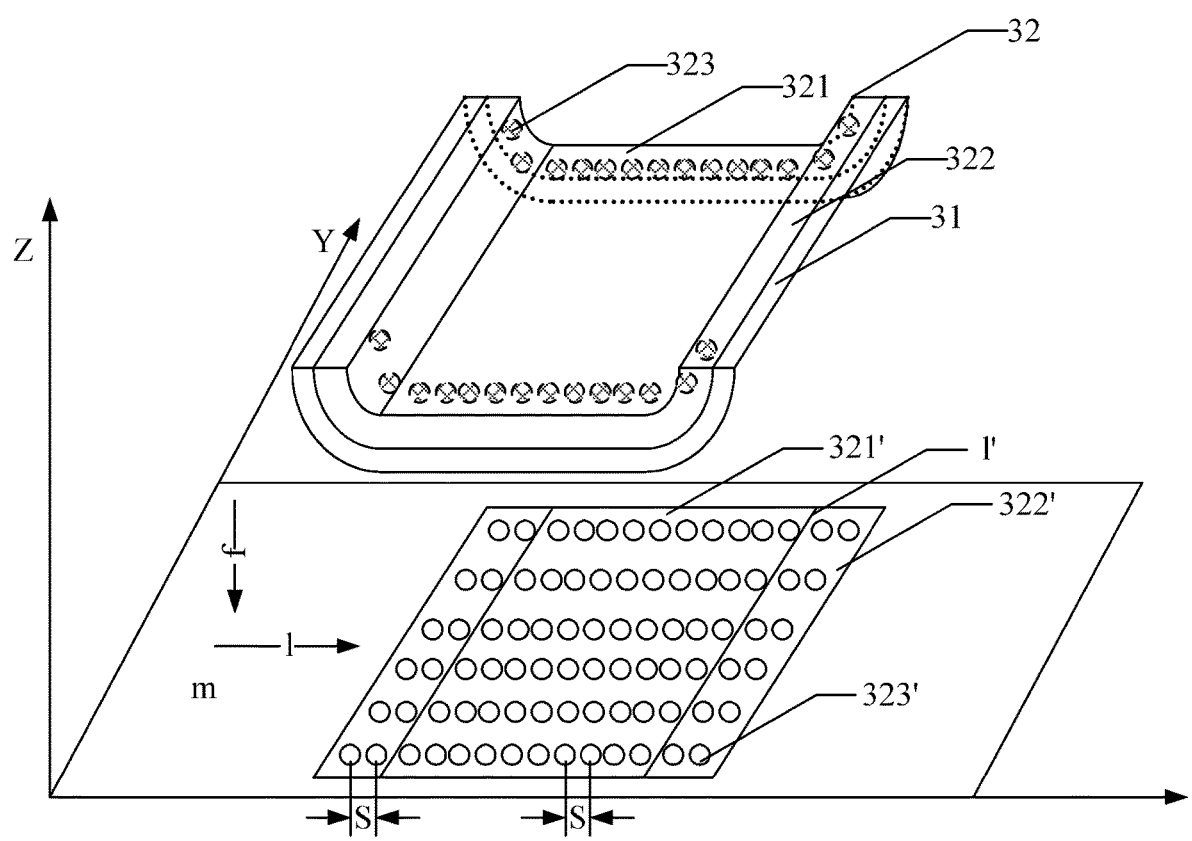
FIG. 3 is a schematic structural diagram of a flexible curved display panel according to an embodiment of the present invention.

As shown in FIG. 3, an object of the present invention is to provide a curved display, display module and a display terminal to prevent the deformation in the bending section. To achieve the above object, an embodiment of the present invention provides a flexible curved display, comprising: a flexible glass portion 31 and a flexible display panel 32 connected to the flexible glass portion 31. Wherein, the flexible display panel 32 comprises a flat section 321 and a bending section 322. The flat section 321 and the bending section 322 project along a same projection direction f to define a first projection area 321' and a second projection area 322', respectively, on a same projection plane m. A plurality of pixels 323 on the flexible display panel 32 projecting along the projection direction f to define plural projection points 323' on the projection plane m. The projection points 323' satisfy a predetermined condition and the predetermined condition comprises same distance S between adjacent projection points along a same reference direction 1. The reference direction 1 extends across the first projection area 321' and the second projection area 322'. All light emitting directions of all pixels 323 on the flexible display panel 32 are the same and parallel to the projection direction f. Thus, display content of the pixels projected along the projection direction f is not deformed.

In an embodiment of the present invention, as shown in FIG. 3, the projection direction f is perpendicular to the projection plane m. In fact, the projection direction f can be designed as an arbitrary direction but the embodiment in FIG. 3 can save manufacturing costs.

In an embodiment of the present invention, as shown in FIG. 3, the reference direction 1 is perpendicular to an intersection 1' of the first projection area 321' and the second projection area 322'. Actually, the reference direction 1 can be designed as an arbitrary direction extending across the first projection area 321' and the second projection area 322'. The embodiment in FIG. 3 is designed for disposing the pixels structure.

In an embodiment of the present invention, the projection plane m is parallel to a surface of the flat section 321. Actually, the projection plane m can be designed as an arbitrary plane. The embodiment in FIG. 3 is designed according to a viewing direction of a current user.

In an embodiment of the present invention, the projection plane m is a surface of the flat section 321.

Figure 4:
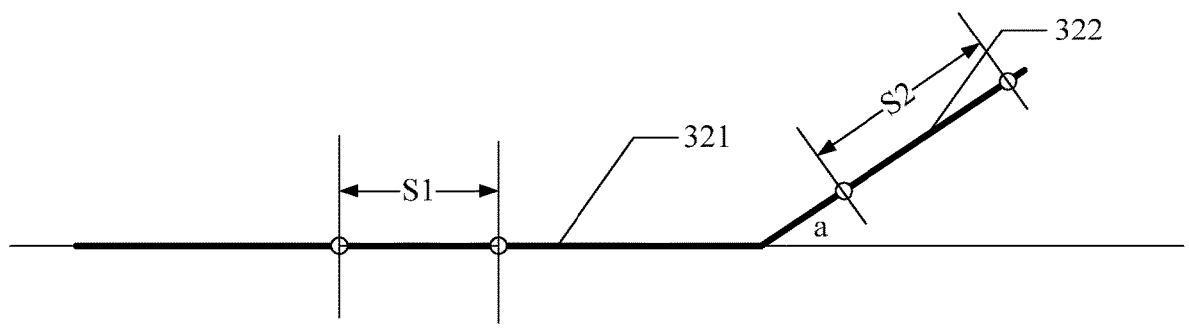
FIG. 4 is a first schematic cross-section diagram of the flexible curved display according to an embodiment of the present invention.
Figure 5:
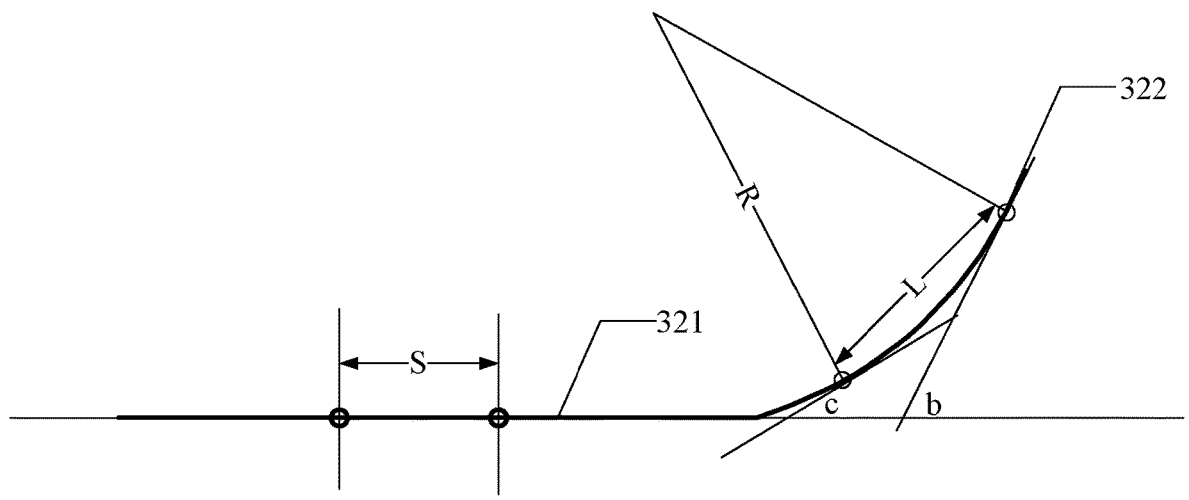
FIG. 5 is a second schematic cross-section diagram of the flexible curved display according to an embodiment of the present invention.

In an embodiment of the present invention, as shown in FIG. 4 or 5, the flexible display panel 32 comprises a flat section 321 and a bending section 322.

In an embodiment of the present invention, as shown in FIG. 4, a cross section of the flat section 321 is a straight line and a cross section of the bending section 322 is a straight line; a distance between adjacent pixels in the flat section along the reference direction is S1. A distance between adjacent pixels in the bending section is S2. An acute angle between the bending section and the flat section is a and satisfies the equation: $S1=S2*\cos(a)$.

In an embodiment of the present invention, as shown in FIG. 5, a cross section of the flat section 321 is a straight line and a cross section of the bending section 322 is an arc line. A distance between adjacent pixels in the flat section along the reference direction is S. Two acute angles between each tangent of the adjacent pixels in the bending section and a surface of the flat section are respectively b and c. Further, a radius of curvature of the bending section is R and satisfies the equation: $S=R*\sin(b)-R*\sin(c)$.

In an embodiment of the present invention, as shown in FIG. 5, a cross section of the flat section 321 is a straight line and a cross section of the bending section 322 is an arc line. A distance between adjacent pixels in the flat section along the reference direction is S. Two acute angles between each tangent of the adjacent pixels in the bending section and a surface of the flat section are respectively b and c. Further, a radius of curvature of the bending section is R. A distance between the adjacent pixels is L and satisfies the equation: $S=R*\sin(b)-R*\sin(c); L=R(b-c)$.

In an embodiment of the present invention, as shown in FIGS. 6-12, both a distance between adjacent pixels in the flat section and in the bending section satisfy the equations mentioned above as in FIG. 4 and FIG. 5.

Figure 6:
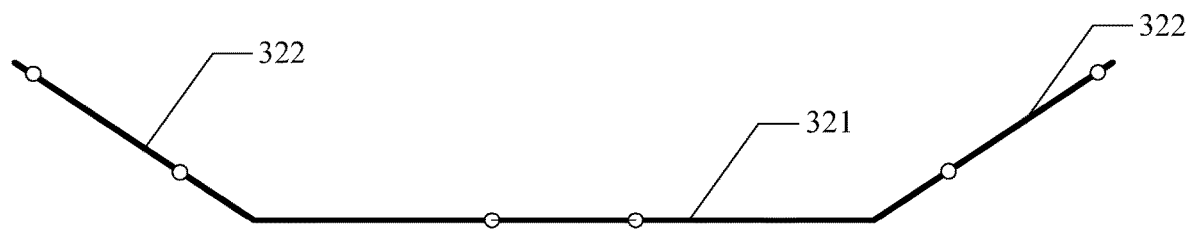
FIG. 6 is a third schematic cross-section diagram of the flexible curved display according to an embodiment of the present invention.

In an embodiment of the present invention, as shown in FIG. 6, the flexible display panel 32 comprises a flat section 321 and two bending sections 322 disposed on two sides of the flat section 321. The bending sections 322 are opposite to each other and both cross sections of the bending sections 322 are straight lines.

Figure 7:
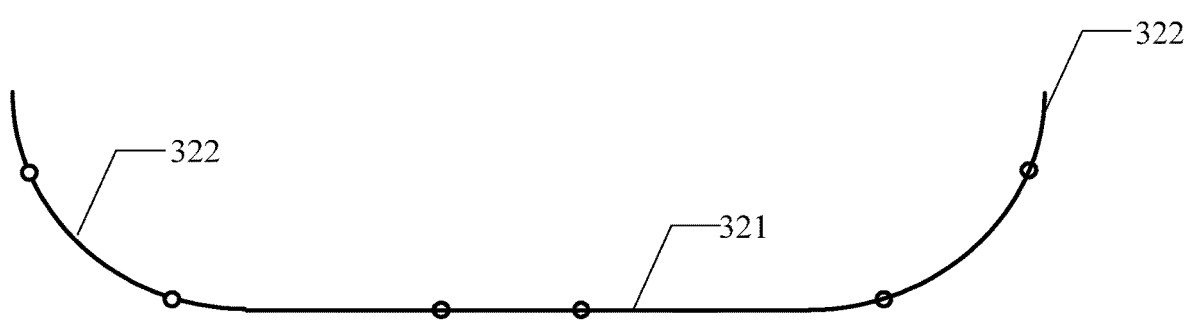
FIG. 7 is a fourth schematic cross-section diagram of the flexible curved display according to an embodiment of the present invention.

In an embodiment of the present invention, as shown in FIG. 7, the flexible display panel 32 comprises a flat section 321 and two bending sections 322 disposed on two sides of the flat section 321. The bending sections 322 are opposite to each other and both cross sections of the bending sections 322 are arc lines.

Figure 8:
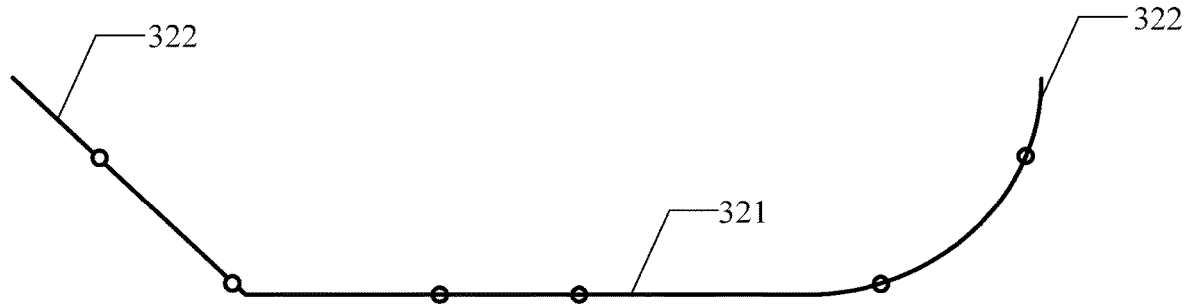
FIG. 8 is a fifth schematic cross-section diagram of the flexible curved display according to an embodiment of the present invention.

In an embodiment of the present invention, as shown in FIG. 8, the flexible display panel 32 comprises a flat area 321 and two bending sections 322 located on two sides of the flat section 321 and the bending sections 322 are opposite to each other. One cross section of the bending sections 322 is an arc line and another cross section of the bending sections 322 is a straight line.

Figure 9:
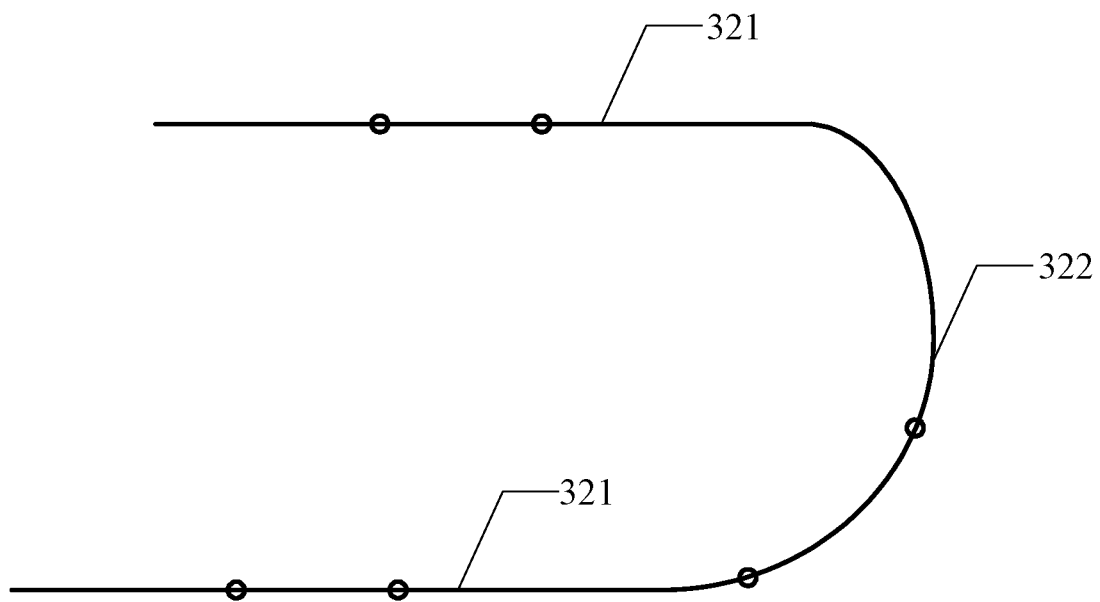
FIG. 9 is a sixth schematic cross-section diagram of the flexible curved display according to an embodiment of the present invention.

In an embodiment of the present invention, as shown in FIG. 9, the flexible display panel 32 comprises two flat sections 321 and a bending section 322 disposed between the flat sections 321. A cross section of the bending section 322 is an arc line.

Figure 10:
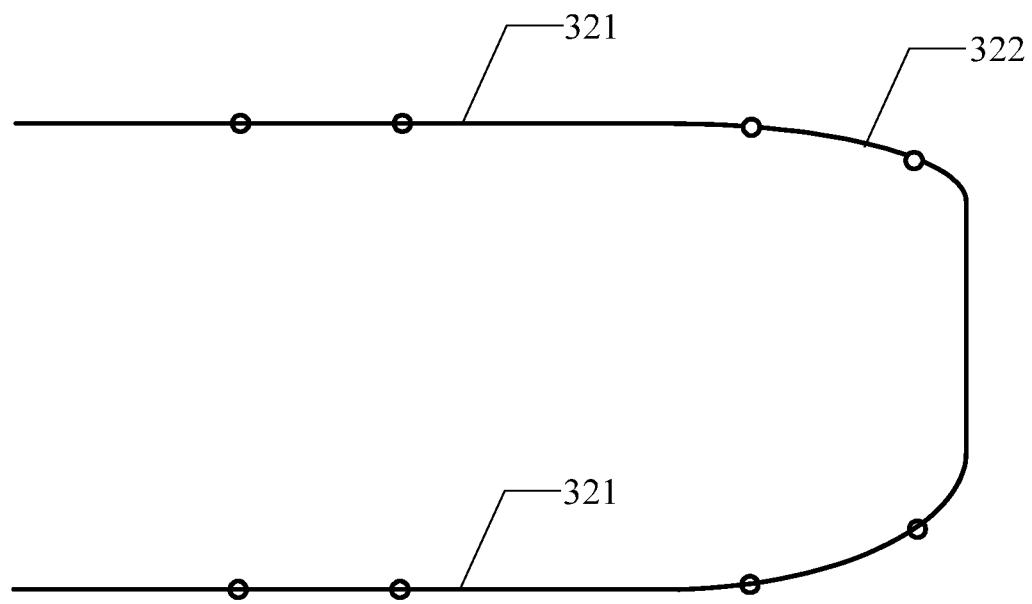
FIG. 10 is a seventh schematic cross-section diagram of the flexible curved display according to an embodiment of the present invention.

In an embodiment of the present invention, as shown in FIG. 10, the flexible display panel 32 comprises two flat sections 321 and a bending section 322 disposed between the flat sections 321. A cross section of the bending section 322 is made of two arc lines and one straight line.

Figure 11:
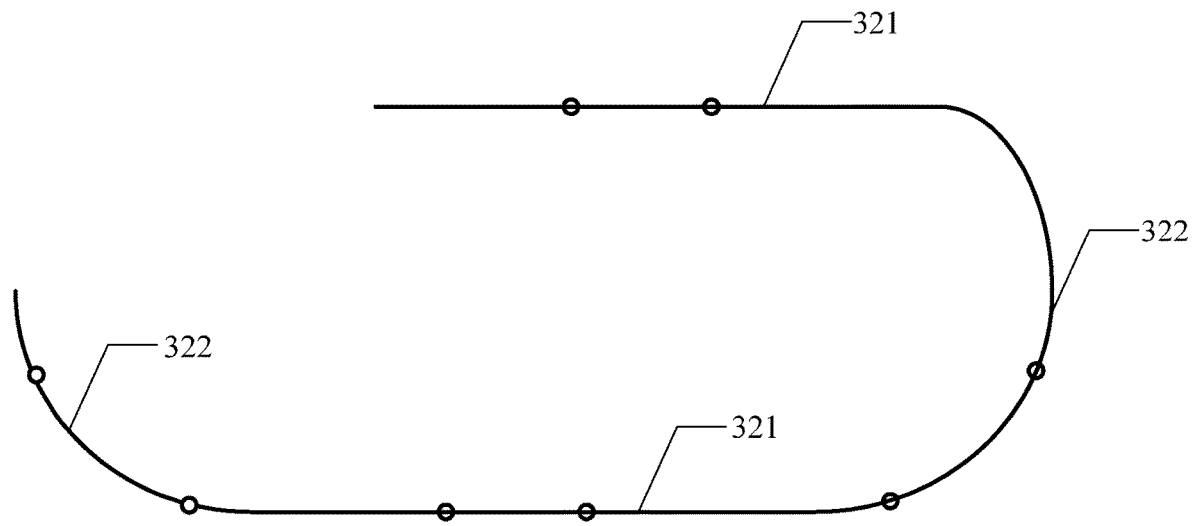
FIG. 11 is an eighth schematic cross-section diagram of the flexible curved display according to an embodiment of the present invention.

In an embodiment of the present invention, as shown in FIG. 11, the flexible display panel 32 comprises two separate flat sections 321 and two bending sections 322. Cross sections of the bending sections 322 are arc lines.

Figure 12:
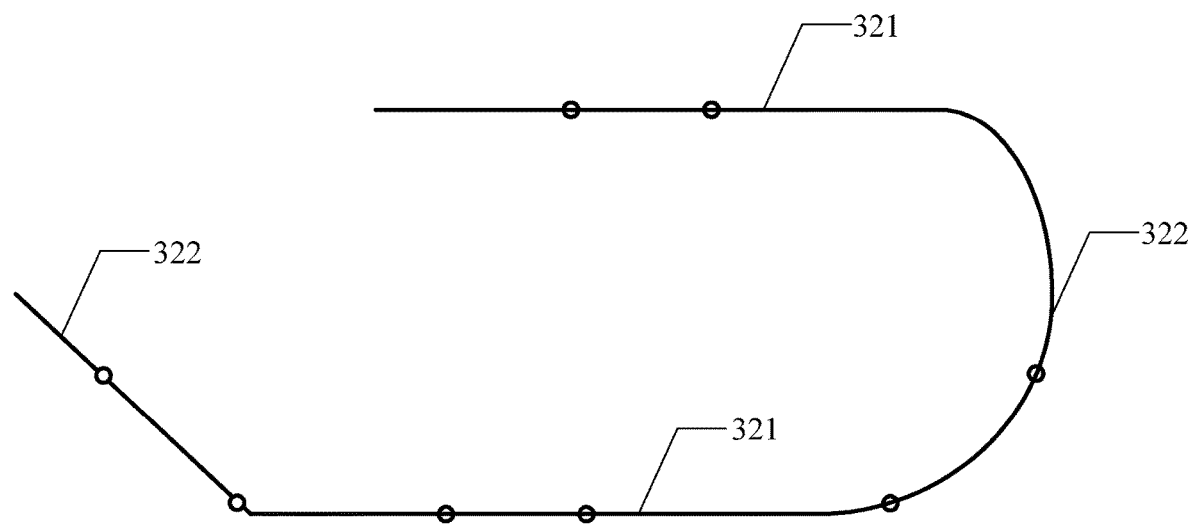
FIG. 12 is a ninth schematic cross-section diagram of the flexible curved display according to an embodiment of the present invention.

In an embodiment of the present invention, as shown in FIG. 12, the flexible display panel 32 comprises two separate flat sections 321 and two bending sections 322 and a cross section of the bending section 322 connected to the flat sections 321 is an arc line. A cross section of another bending section 322 is a straight line.

Preferably, in an embodiment of the present invention, the arc lines mentioned above have same curvature radius or similar curvature radius.

Figure 13:
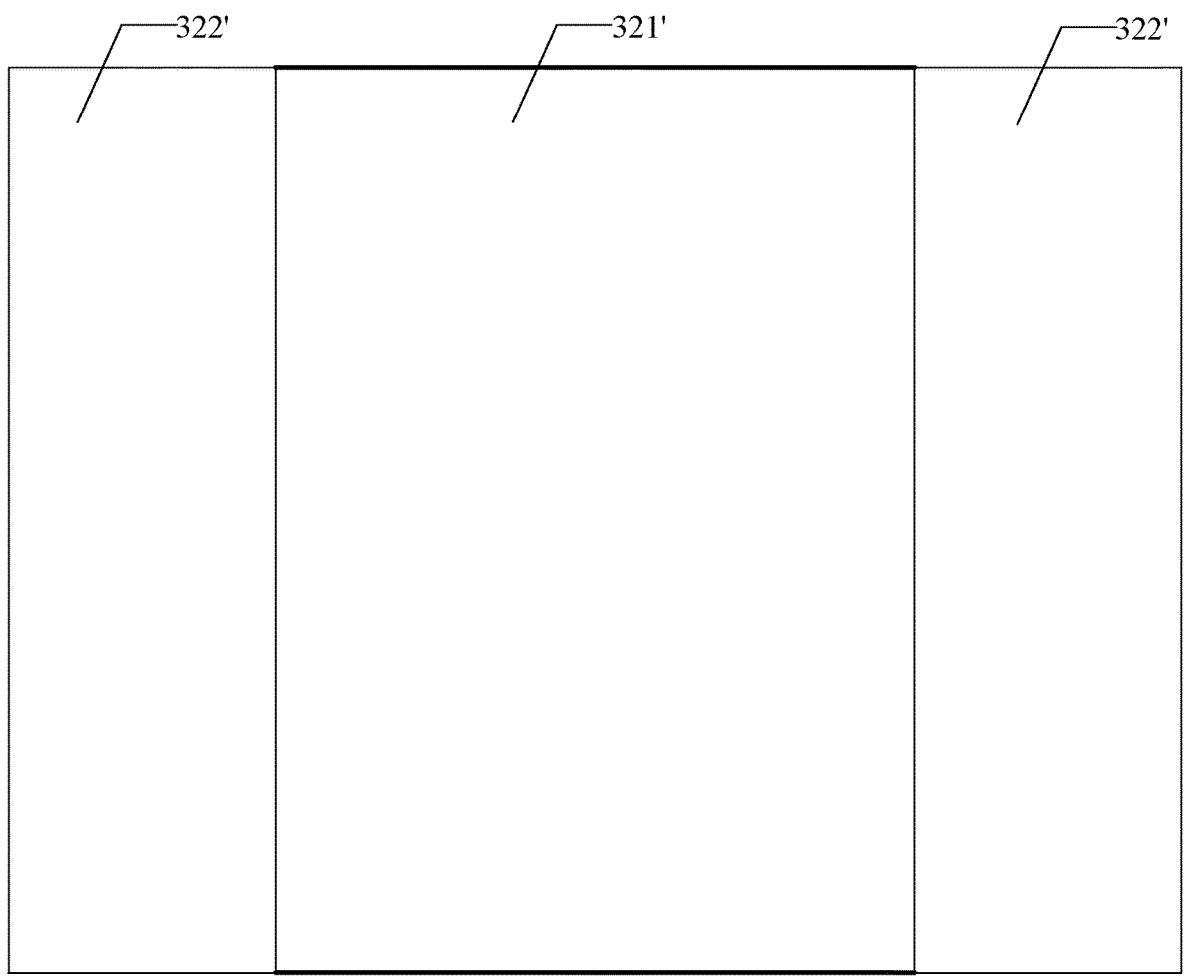
FIG. 13 is a first shape schematic diagram of a first projection area according to an embodiment of the present invention.

Preferably, as shown in FIG. 13, a shape of the first projection section 321' is a rectangle or a square or another regular shape.

Figure 14:
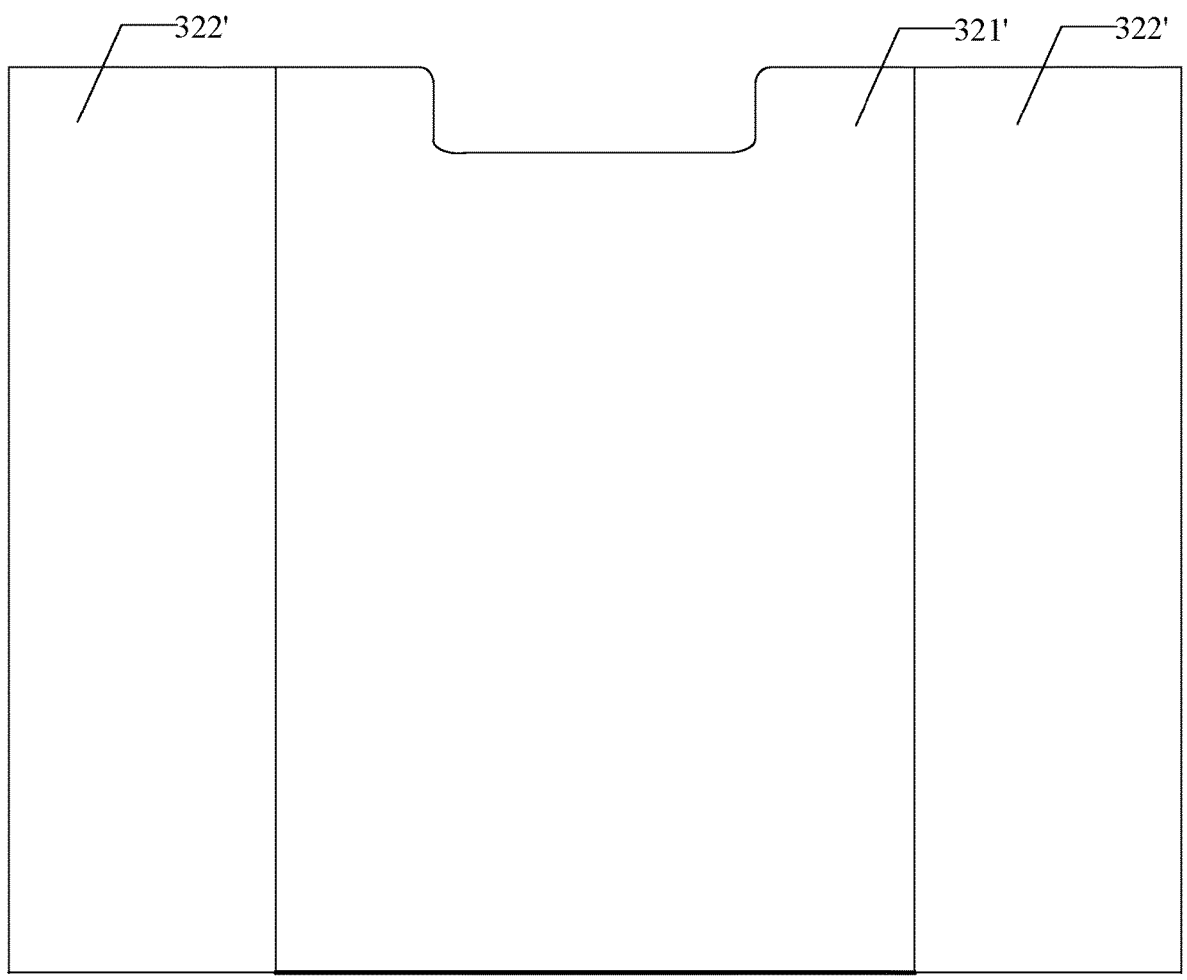
FIG. 14 is a second shape schematic diagram of the first projection area according to an embodiment of the present invention.

Preferably, as shown in FIG. 14, a shape of the first projection section 321' is irregular.

An advantage of the embodiment of the present invention is to provide a display module having a flexible curved display. The flexible curved display comprises a flexible glass portion and a flexible display panel connected to the flexible glass portion; wherein, the flexible display panel comprises a flat section and a bending section, the flat section and the bending section projecting along a same projection direction to respectively define a first projection area and a second projection area on a same projection plane; a plurality of pixels on the flexible display panel projecting along the projection direction to define plural projection points on the projection plane, the projection points satisfying a predetermined condition, and the predetermined condition comprising same distance between adjacent projection points along a same reference direction, and the reference direction extending across the first projection area and the second projection area. Therefore, if we look toward the display terminal along the projection direction. The distance between the subpixels of the bending section is the same as the distance between the subpixels of the flat section. Thus, the display content of the bending section isn't pressed to have the deformation. The present invention can solve the deformation issues of the conventional flexible curved display and can effectively result in better display performance.

Preferably, the present invention provides a display terminal and the display terminal comprises the display module. Therefore, if we look toward the display terminal along the projection direction. The distance between the subpixels of the bending section is the same as the distance between the subpixels of the flat section. Thus, the display content of the bending section isn't pressed to have the deformation. The present invention can solve the deformation issues of the conventional flexible curved display and can effectively result in better display performance.

According to the embodiment of the present invention, it is to provide a display module having a flexible curved display. The flexible curved display comprises a flexible glass portion and a flexible display panel connected to the flexible glass portion; wherein, the flexible display panel comprises a flat section and a bending section, the flat section and the bending section projecting along a same projection direction to respectively define a first projection area and a second projection area on a same projection plane; a plurality of pixels on the flexible display panel projecting along the projection direction to define plural projection points on the projection plane, the projection points satisfying a predetermined condition, and the predetermined condition comprising same distance between adjacent projection points along a same reference direction, and the reference direction extending across the first projection area and the second projection area.

Therefore, if we look toward the display terminal along the projection direction. The distance between the subpixels of the bending section is the same as the distance between the subpixels of the flat section. Thus, the display content of the bending section isn't pressed to have the deformation. The present invention can solve the deformation issues of the conventional flexible curved display and can effectively result in better display performance.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

The invention claimed is:

1. A flexible curved display, comprising:
a flexible glass portion and a flexible display panel connected to the flexible glass portion;
wherein, the flexible display panel comprises a flat section and a bending section, the flat section and the bending section projecting along a same projection direction to define a first projection area and a second projection area, respectively, on a same projection plane;
a plurality of pixels on the flexible display panel projecting along the projection direction to define plural projection points on the projection plane;
the projection points satisfying a predetermined condition, the predetermined condition comprising a same distance between adjacent projection points along a same reference direction; the reference direction extending across the first projection area and the second projection area; and
all light emitting directions of all pixels on the flexible display panel being same and parallel to the projection direction.

2. The flexible curved display of claim 1, wherein the flexible display panel comprises a flat section, a bending section and a cross section of the bending section is a straight line.

3. The flexible curved display of claim 1, wherein the flexible display panel comprises a flat section, a bending section and a cross section of the bending section is an arc line.

4. The flexible curved display of claim 1, wherein the flexible display panel comprises a flat section and two bending sections disposed on two sides of the flat section, wherein the bending sections are opposite to each other and both cross sections of the bending sections are straight lines.

5. The flexible curved display of claim 1, wherein the flexible display panel comprises a flat section and two bending sections disposed on two sides of the flat section, wherein the bending sections are opposite to each other and both cross sections of the bending sections are arc lines.

6. The flexible curved display of claim 1, wherein the flexible display panel comprises a flat area and two bending sections located on two sides of the flat section, wherein the bending sections are opposite to each other and one cross section of the bending sections is an arc line and another cross section of the bending sections is a straight line.

7. The flexible curved display of claim 1, wherein the flexible display panel comprises two flat sections and a bending section disposed between the flat sections and a cross section of the bending section is an arc line.

8. The flexible curved display of claim 1, wherein the flexible display panel comprises two flat sections and a bending section disposed between the flat sections and a cross section of the bending section is made of two arc lines and one straight line.

9. The flexible curved display of claim 1, wherein the flexible display panel comprises two separate flat sections and two bending sections and cross sections of the bending sections are arc lines.

10. The flexible curved display of claim 1, wherein the flexible display panel comprises two separate flat sections and two bending sections and a cross section of the bending section connected to the flat sections is an arc line and a cross section of another bending section is a straight line.

11. A flexible curved display, comprising:
a flexible glass portion and a flexible display panel connected to the flexible glass portion;
wherein, the flexible display panel comprises a flat section and a bending section, the flat section and the bending section projecting along a same projection direction to respectively define a first projection area and a second projection area on a same projection plane;
a plurality of pixels on the flexible display panel projecting along the projection direction to define plural projection points on the projection plane, the projection points satisfying a predetermined condition, and the predetermined condition comprising same distance between adjacent projection points along a same reference direction, and the reference direction extending across the first projection area and the second projection area.

12. The flexible curved display of claim 11, wherein a cross section of the flat section is a straight line and a cross section of the bending section is a straight line; a distance between adjacent pixels in the flat section along the reference direction is S1; a distance between adjacent pixels in the bending section is S2; an acute angle between the bending section and the flat section is a and satisfies the equation: $S1=S2*\cos(a)$.

13. The flexible curved display of claim 11, wherein a cross section of the flat section is a straight line and a cross section of the bending section is an arc line; a distance between adjacent pixels in the flat section along the reference direction is S; two acute angles between each tangent of the adjacent pixels in the bending section and a surface of the flat section are respectively b and c;
further a radius of curvature of the bending section is R and satisfies the equation: $S=R*\sin(b)-R*\sin(c)$.

14. The flexible curved display of claim 13, wherein a distance between the adjacent pixels is L and satisfies the equation: $L=R(b-c)$.

15. The flexible curved display of claim 11, wherein the projection direction is perpendicular to the projection plane.

16. The flexible curved display of claim 11, wherein the reference direction is perpendicular to an intersection of the first projection area and the second projection area.

17. The flexible curved display of claim 11, wherein the projection plane is parallel to a surface of the flat section or the projection plane is a surface of the flat section.

18. The flexible curved display of claim 11, wherein a shape of the first projection section is irregular.

19. A display module comprising the flexible curved display of claim 1.

20. A display terminal comprising the display module of claim 19.

\* \* \* \* \*